(12) United States Patent
Umeda et al.

(10) Patent No.: US 10,660,229 B2
(45) Date of Patent: May 19, 2020

(54) ELECTRICAL DEVICE AND MANUFACTURING METHOD OF THE SAME

(71) Applicants: TOYOTA JIDOSHA KABUSHIKI KAISHA, Toyota-shi, Aichi-ken (JP); DENSO CORPORATION, Kariya, Aichi-pref (JP)

(72) Inventors: Hiroki Umeda, Toyota (JP); Kenshi Yamanaka, Nukata-gun (JP); Shinichi Miura, Toyota (JP); Hiromi Yamasaki, Toyota (JP); Hitoshi Imura, Chiryu (JP); Yutaka Morimoto, Toyokawa (JP); Kazuki Hayashi, Toyota (JP); Hideaki Tachibana, Kariya (JP); Yoshiki Kawaguchi, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/204,430

(22) Filed: Nov. 29, 2018

(65) Prior Publication Data

US 2019/0174647 A1 Jun. 6, 2019

(30) Foreign Application Priority Data

Dec. 6, 2017 (JP) .................. 2017-234582
Aug. 2, 2018 (JP) .................. 2018-145891

(51) Int. Cl.
*H02B 1/32* (2006.01)
*H05K 7/14* (2006.01)
(Continued)

(52) U.S. Cl.
CPC ............ *H05K 7/1432* (2013.01); *B60L 50/51* (2019.02); *H02B 1/32* (2013.01); *H02M 3/1584* (2013.01)

(58) Field of Classification Search
None
See application file for complete search history.

(56) References Cited

U.S. PATENT DOCUMENTS 5,995,380 A * 11/1999 Maue .................. B60R 16/0238
174/254
6,315,578 B1 * 11/2001 Kasai .................. H01R 9/2458
439/404

(Continued)

FOREIGN PATENT DOCUMENTS

| JP | H11-121690 A | 4/1999 |
| JP | 2015-204688 A | 11/2015 |
| JP | 2018-170894 A | 11/2018 |

*Primary Examiner* — Courtney L Smith
(74) *Attorney, Agent, or Firm* — Oliff PLC

(57) ABSTRACT

An electrical device is provided. The electrical device includes a case, a first electrical part, a second electrical part, and a connecting portion. The case includes a first case and a second case coupled to the first case. The first electrical part is fixed to the first case. The second electrical part is fixed to the second case. The connecting portion is configured to connect a first conductor extending from the first electrical part and a second conductor extending from the second electrical part each other. Either one of the first case and the second case includes a through hole. The connecting portion is disposed so as to be entirely visible from the through hole as viewed from an outside of the case.

16 Claims, 13 Drawing Sheets

(51) Int. Cl.
*H02M 3/158* (2006.01)
*B60L 50/51* (2019.01)

(56) References Cited

U.S. PATENT DOCUMENTS

| | | | |
|---|---|---|---|
| 6,430,054 B1* | 8/2002 | Iwata | H05K 7/026 |
| | | | 174/560 |
| 6,835,073 B2* | 12/2004 | Kobayashi | H01R 9/226 |
| | | | 439/449 |
| 8,416,575 B2* | 4/2013 | Sato | H01R 9/226 |
| | | | 174/260 |
| 8,829,669 B2 | 9/2014 | Hotta et al. | |
| 9,397,485 B2* | 7/2016 | Melchor Saucedo | |
| | | | B60R 16/0238 |
| 9,601,274 B2 | 3/2017 | Kojima et al. | |
| 10,153,565 B2* | 12/2018 | Zhao | B60R 16/0238 |
| 2004/0007379 A1* | 1/2004 | Suzuki | H05K 7/026 |
| | | | 174/59 |
| 2018/0281605 A1 | 10/2018 | Sawazaki et al. | |

* cited by examiner

ELECTRICAL DEVICE AND MANUFACTURING METHOD OF THE SAME

INCORPORATION BY REFERENCE

The disclosure of Japanese Patent Application No. 2018-145891 filed on Aug. 2, 2018 including the specification, drawings and abstract is incorporated herein by reference in its entirety.

BACKGROUND

1. Technical Field

A technique described in the present specification relates to an electrical device. Specifically, the technique relates to an electrical device including a case composed of a plurality of case portions and its manufacturing method.

2. Description of Related Art

Generally, a case of an electrical device houses electrical parts and is covered with a cover. Japanese Patent Application Publication No. 2015-204688 (JP 2015-204688 A) describes an example of such an electrical device.

SUMMARY

Strict requirements for an outline size of an electrical device mounted on a vehicle include housing a large number of electrical parts in a case with good space efficiency. For example, improved space efficiency in the case can be expected by housing electrical parts in a plurality of case portions that compose the case. However, it is difficult to electrically connect the electrical parts that are housed in separate case portions. The present specification provides an electrical device that enables electrical connection between electrical parts housed in separate case portions with good work efficiency, and a manufacturing method of the electrical device.

The present specification relates to an electrical device. The electrical device is provided with a case including a first case and a second case coupled to the first case, a first electrical part fixed to the first case, a second electrical part fixed to the second case, and a connecting portion configured to connect a first conductor extending from the first electrical part and a second conductor extending from the second electrical part each other. Either one of the first case and the second case includes a through hole. The connecting portion is disposed so as to be entirely visible from the through hole as viewed from an outside of the case. The structure described above allows connection between the first conductor and the second conductor via the through hole after the first case and the second case are coupled to each other, as well as electrical connection between the electrical parts housed in separate case portions with good work efficiency.

The present specification relates to a manufacturing method of the electrical device described above. The manufacturing method includes fixing the first electrical part to the first case, fixing the second electrical part to the second case, coupling the first case to the second case, and connecting the first conductor to the second conductor with a connecting tool via the through hole. Detailed techniques of the present specification and further improvements are described below.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

First Embodiment

Figure 1:
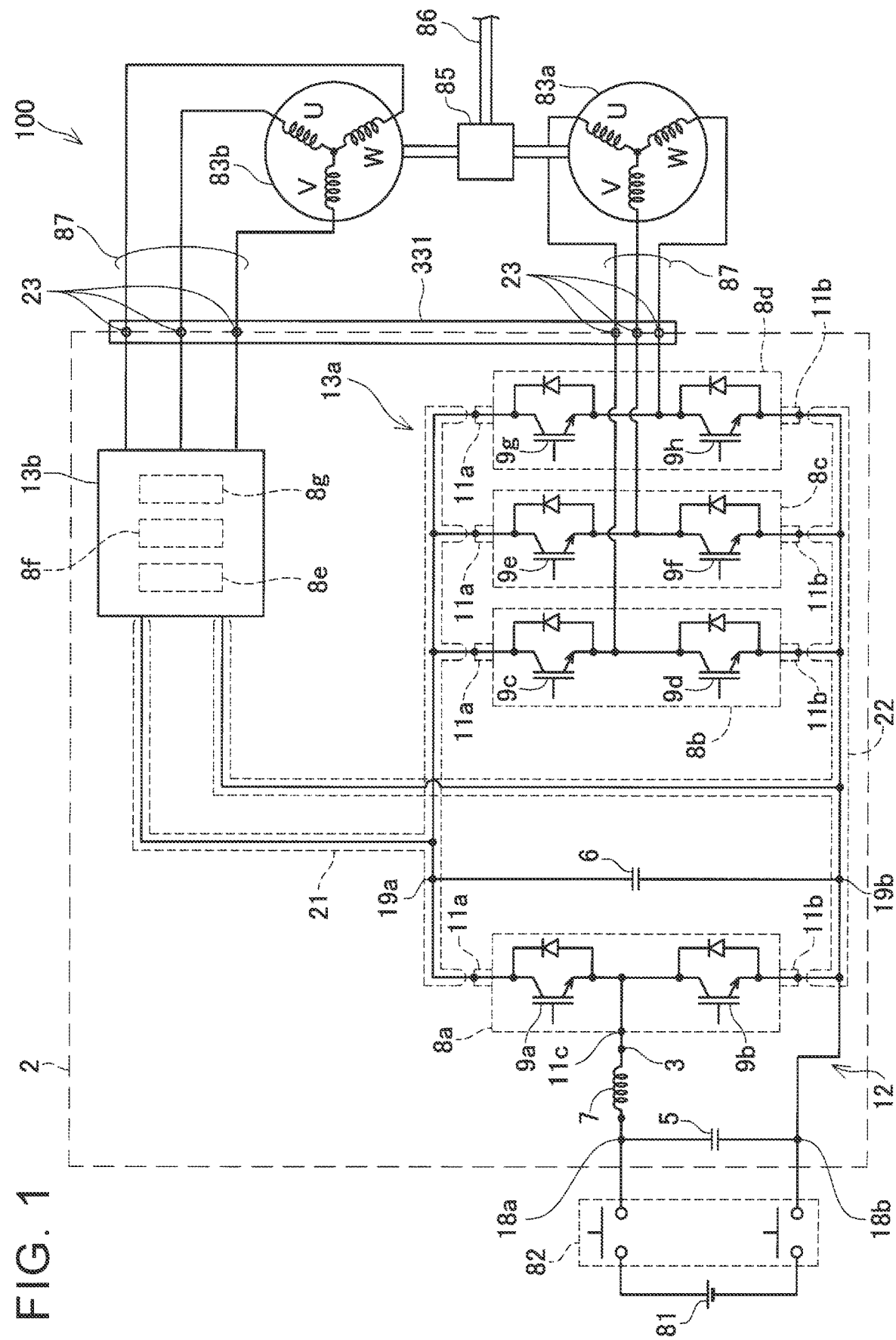
FIG. 1 is a diagram illustrating a circuit of an electrical device (power converter) according to a first embodiment.

A description will be provided on an electrical device according to a first embodiment with reference to the drawings. The electrical device according to the first embodiment is a power converter 2 that is mounted in an electric vehicle 100. FIG. 1 shows a block diagram of a power system of the electric vehicle 100 including the power converter 2. The electric vehicle 100 includes motors 83a, 83b for traveling. The power converter 2 is a device that converts DC power of a battery 81 into power suited to drive the motors 83a, 83b for traveling.

The electric vehicle 100 includes the two motors 83a, 83b for traveling. Output of the two motors 83a, 83b is combined by a gear box 85 and transmitted to an axle 86 (that is, driving wheels).

The power converter 2 is connected to the battery 81 via a system main relay 82. The power converter 2 includes a voltage converter circuit 12 for boosting a voltage of the battery 81 and two sets of inverter circuits 13a, 13b for converting the boosted DC power into AC power. A first inverter circuit 13a generates driving power for the motor 83a for traveling, and a second inverter circuit 13b generates driving power for the motor 83b for traveling.

The voltage converter circuit 12 is a two-way DC-DC converter that allows boost operation in which the voltage applied to a terminal on the battery side is boosted and output to a terminal on the inverter side, and voltage drop operation in which the voltage applied to the terminal on the inverter side is dropped and output to the terminal on the battery side. For convenience of description, the terminal on the battery side (low-voltage side) is referred to as an input end and the terminal on the inverter side (high-voltage side) is referred to as an output end. A positive electrode of the input end is referred to as an input positive end 18a and a negative electrode of the input end is referred to as an input negative end 18b. A positive electrode of the output end is referred to as an output positive end 19a and a negative electrode of the output end is referred to as an output negative end 19b. References of the "input end" and the "output end" are used for convenience of description. Since the voltage converter circuit 12 is a two-way DC-DC converter as described above, power may flow from the output end to the input end.

The voltage converter circuit 12 includes a series circuit having two switching elements 9a, 9b, a reactor 7, a filter capacitor 5, and diodes connected to each switching element 9a, 9b in an anti-parallel manner. One end of the reactor 7 is connected to the input positive end 18a and the other end of the reactor 7 is connected to the midpoint of the series circuit. The filter capacitor 5 is connected between the input positive end 18a and the input negative end 18b. The input negative end 18b is directly connected to the output negative end 19b. The switching element 9b is mainly involved in the boosting operation, whereas the switching element 9a is mainly involved in the voltage drop operation. Since the voltage converter circuit 12 illustrated in FIG. 1 is well-known, detailed description thereof will be omitted. A range of the circuit denoted by a reference sign 8a and represented by a dashed line box corresponds to a power module 8a described later. Reference signs 11a, 1 b, 11c denote terminals extending from the power module 8a. The reference sign 11a denotes a terminal (a positive terminal 11a) conducting with a high-potential side of the series circuit of the switching elements 9a, 9b. The reference sign 11b denotes a terminal (a negative terminal 11b) conducting with a low-potential side of the series circuit of the switching elements 9a, 9b. The reference sign 11c denotes a terminal (a midpoint terminal) conducting with a midpoint of the series circuit of the switching elements 9a, 9b.

The inverter circuit 13a consists of three sets of series circuits connected in parallel to each other, each series circuit having two switching elements. Switching elements 9c and 9d, switching elements 9e and 9f, and switching elements 9g and 9h each configure a series circuit. A diode is connected to each switching element in an anti-parallel manner. Terminals on the high-potential side (positive terminals 11a) of the three sets of the series circuits are connected to the output positive end 19a of the voltage converter circuit 12, and terminals on the low-potential side (negative terminals 11b) of the three sets of the series circuits are connected to the output negative end 19b of the voltage converter circuit 12. Three-phase ACs (U phase, V phase, W phase) are output from the midpoint terminals of the three sets of the series circuits. Each of the three sets of the series circuits corresponds to power modules 8d, 8c, 8d described later.

The configuration of the inverter circuit 13b is the same as that of the inverter circuit 13a. Thus, the configuration of the inverter circuit 13b is not illustrated in detail in FIG. 1. As with the inverter circuit 13a, the inverter circuit 13b also consists of three sets of series circuits connected in parallel to each other, each series circuit having two switching elements. Terminals on the high-potential side of the three sets of the series circuits are connected to the output positive end 19a of the voltage converter circuit 12, and terminals on the low-potential side of the three sets of the series circuits are connected to the output negative end 19b of the voltage converter circuit 12. Hardware corresponding to each series circuit is referred to as power modules 8e, 8f, 8g.

A smoothing capacitor 6 is connected in parallel to the input ends of the inverter circuits 13a, 13b. In other words, the smoothing capacitor 6 is connected in parallel to the output end of the voltage converter circuit 12. The smoothing capacitor 6 eliminates pulsation of current flowing between the voltage converter circuit 12 and the inverter circuits 13a, 13b.

The switching elements 9a to 9h are transistors. An insulated gate bipolar transistor (IGBT) is typically used; however, other transistors such as a metal oxide semiconductor field effect transistor (MOSFET) may be used. The switching element referred to herein is used for power conversion and sometimes referred to as a power semiconductor element. The same applies to the switching elements included in the power modules 8e, 8f, 8g.

In FIG. 1, each of the dashed lines 8a to 8g corresponds to the power module. The power converter 2 is provided with seven sets of the series circuits having two switching elements. As hardware, two switching elements that constitute a series circuit and a diode connected to each switching element in an anti-parallel manner are housed in one package (power module). Hereinafter, when referring to any one of the power modules 8a to 8g without distinction, the any one of the power modules 8a to 8g is denoted as a power module.

Terminals on the high-potential side (positive terminals 11a) of the seven power modules (seven sets of the series circuits) are connected to a positive electrode of the smoothing capacitor 6, and terminals on the low-potential side (negative terminals 11b) are connected to a negative electrode of the smoothing capacitor 6. Conductive paths surrounded by dashed lines denoted by a reference sign 21 in FIG. 1 correspond to a bus bar (a positive bus bar 21) that connects the positive terminals 11a of the power modules and the positive electrode of the smoothing capacitor 6 to each other. Conductive paths surrounded by dashed lines denoted by a reference sign 22 correspond to a bus bar (a negative bus bar 22) that connects the negative terminals 11b and the negative electrode of the smoothing capacitor 6 to each other.

The midpoint terminal of each of the power modules 8b to 8d is connected to the motor 83a, and the midpoint terminal of each of the power modules 8e to 8g is connected to the motor 83b. The hardware configuration of the power converter 2 is described in detail below. The midpoint terminals of the six power modules 8b to 8g are connected to six connection terminals 23 disposed in a through hole 331 of the case of the power converter 2 that is provided for connecting connectors. The six connection terminals 23 are connected to power cables 87 extending from the motors 83a, 83b.

A midpoint terminal 11c of the power module 8a is connected to one end of the reactor 7. The hardware configuration of the midpoint terminal 11c of the power module 8a and a connecting portion 3 of the reactor 7 is described below.

Figure 2:
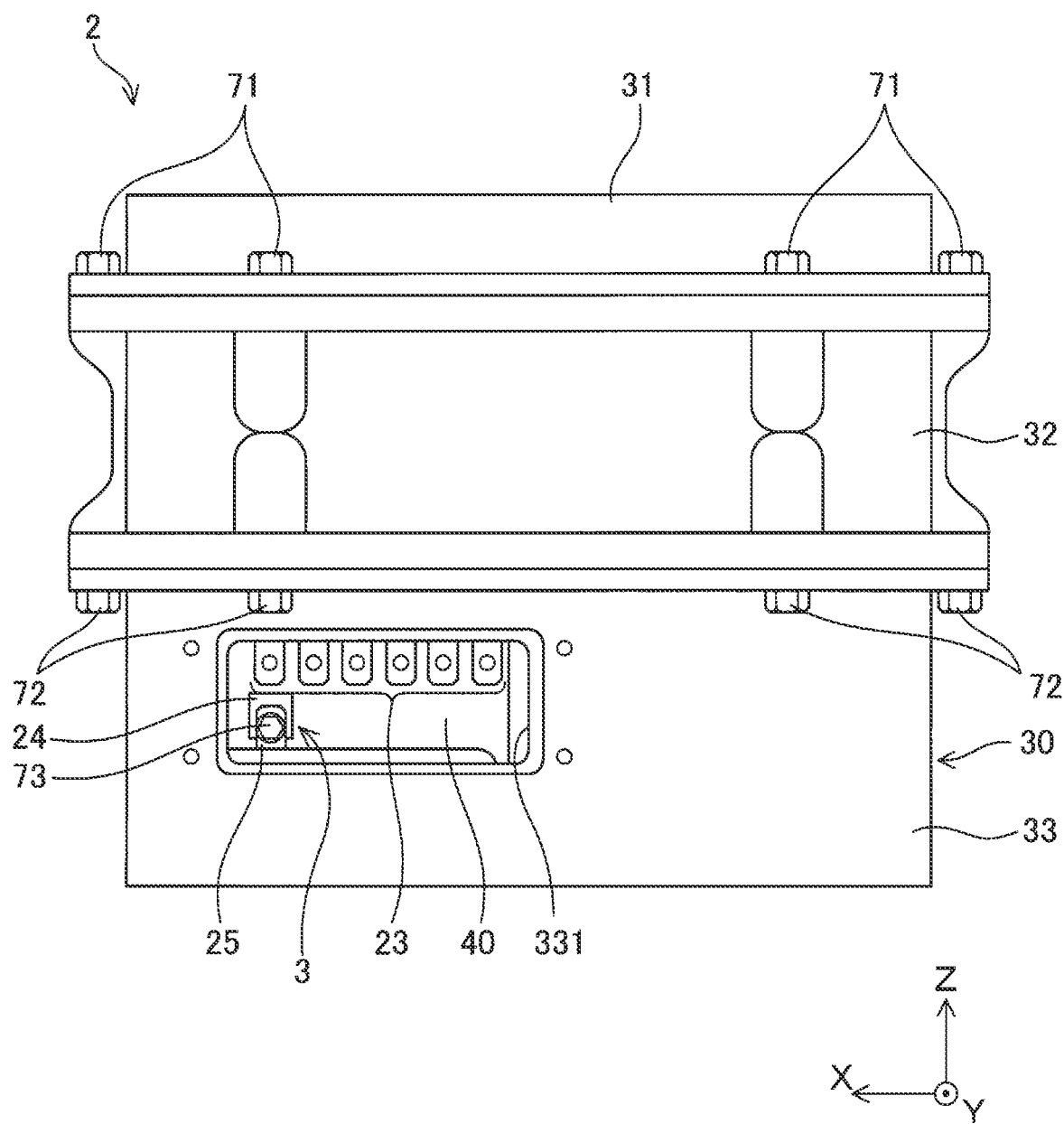
FIG. 2 is a lateral view of the power converter.
Figure 3:
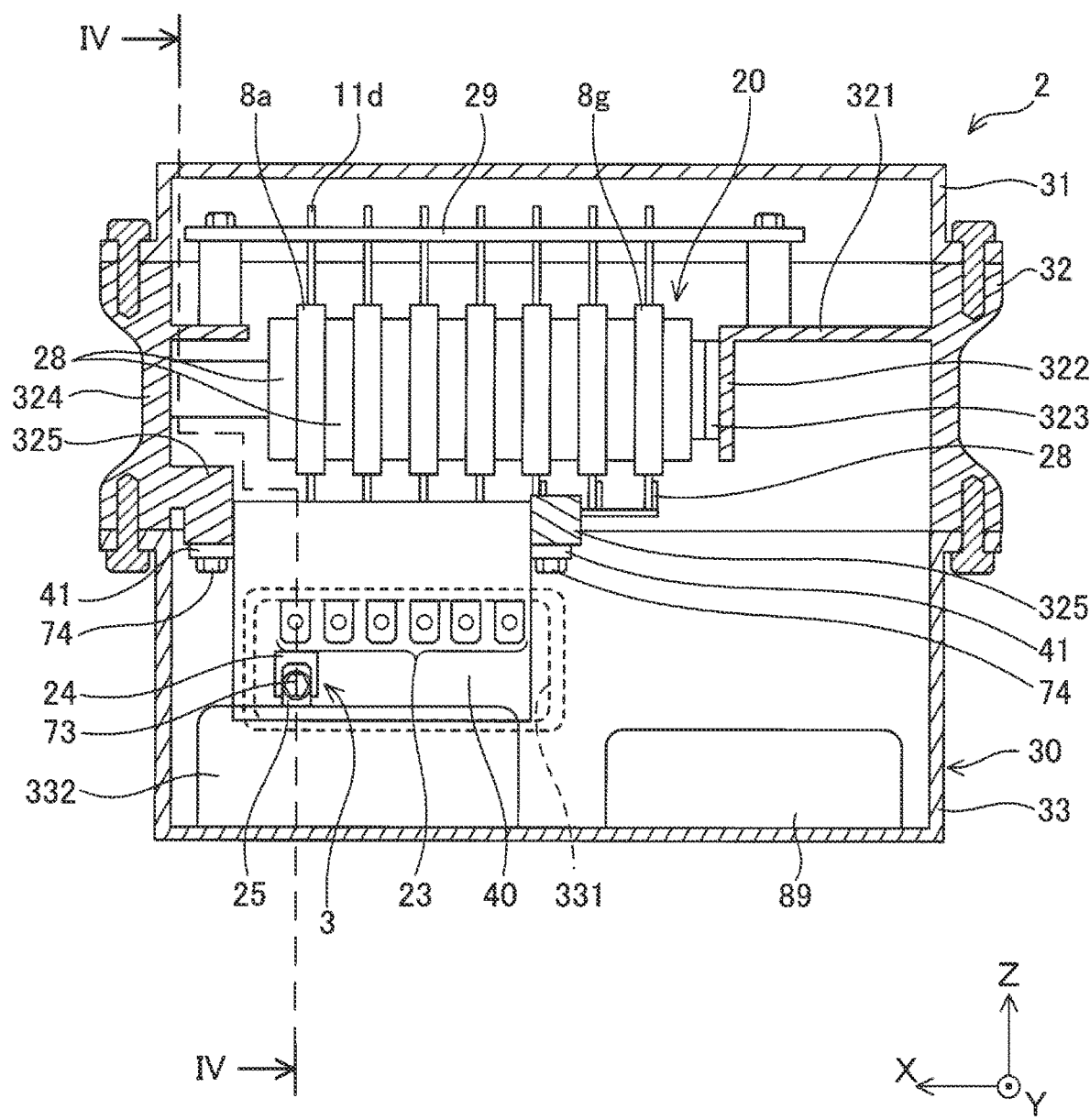
FIG. 3 is a sectional view of the power converter with a cut side plate.
Figure 4:
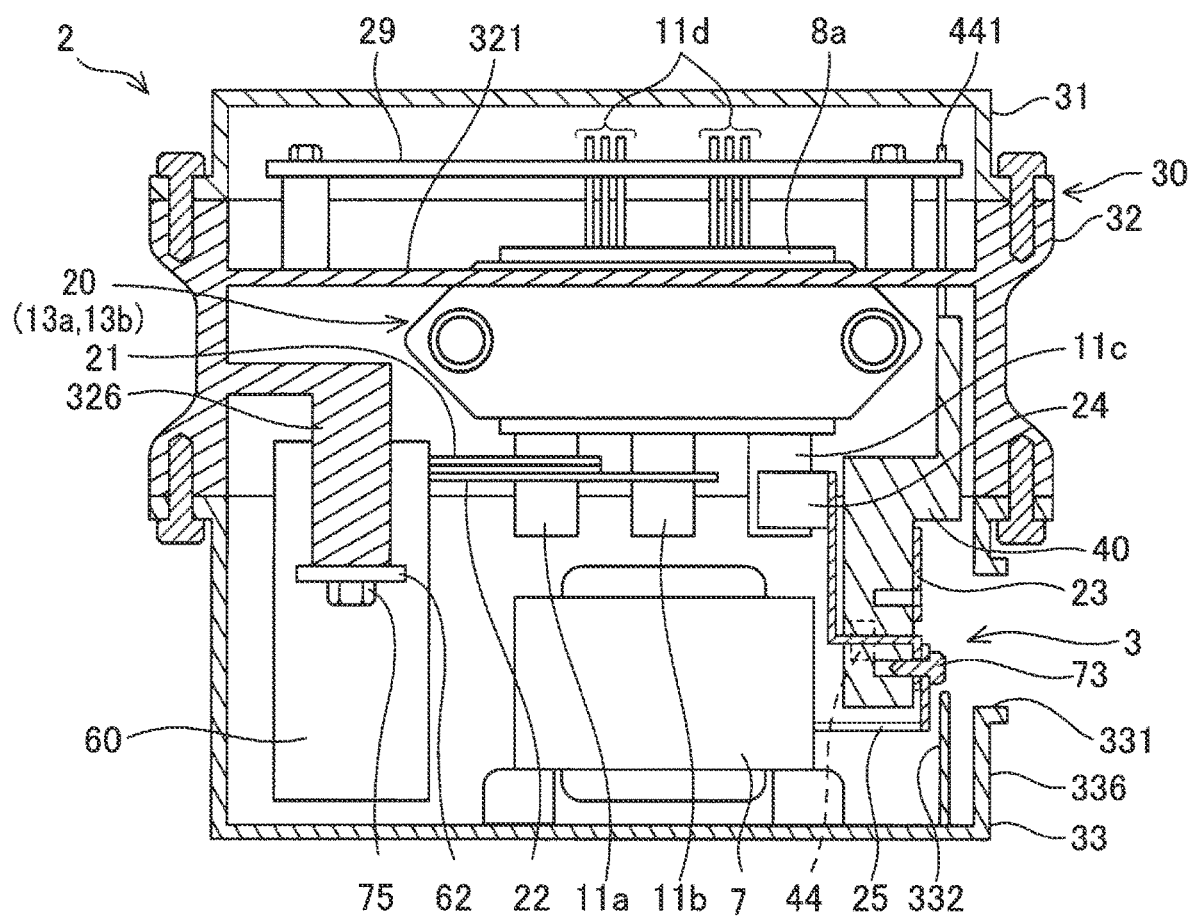
FIG. 4 is a sectional view of the power converter taken along a line IV-IV in FIG. 3.

FIG. 2 illustrates a lateral view of the power converter 2. FIG. 3 illustrates a sectional view of the power converter 2 with a side plate on the front side illustrated in FIG. 2 cut off. The side plate on the front side illustrated in FIG. 2 is provided with the through hole 331. In FIG. 3, the position of the through hole 331 is denoted by a dashed line. FIG. 4 illustrates a sectional view of the power converter 2 taken along a line IV-IV in FIG. 3.

The case 30 of the power converter 2 includes an upper cover 31, an upper case 32, and a lower case 33. The top and bottom of the upper case 32 are open. An upper opening of the upper case 32 is covered with the upper cover 31, and a lower opening of the upper case 32 is covered with the lower case 33. The upper cover 31 is attached to the upper case 32 with a plurality of bolts 71. The lower case 33 is attached to the upper case 32 with a plurality of bolts 72. The lower case 33 is provided with the through hole 331 through which the connectors (not illustrated) of the power cables 87 (see FIG. 1) extend from the motors 83a, 83b. Six connection terminals 23 to which the connectors of the power cables 87 are connected are disposed so as to be visible from the through hole 331 when viewed from the outside of the case 30. The through hole 331 is provided in a side surface 336 of the lower case 33. Each of the six connection terminals 23 conducts with the midpoint terminal of a corresponding one of the six power modules 8b to 8g.

As illustrated in FIG. 3, each of the seven power modules 8a to 8g and a plurality of cooling units 28 are layered alternately with each other. In FIG. 3, reference signs are provided for the power modules 8a and 8g only, while reference signs for the power modules 8b to 8f therebetween are omitted. In addition, in FIG. 3, a reference sign 28 is provided for the first two cooling units from the left end, while the reference sign 28 for the rest of the cooling units are omitted. A layered body 20 formed of the power modules and the cooling units 28 is housed in and fixed to the upper case 32. The upper case 32 is provided with an intermediate plate 321. As illustrated in FIG. 3, a supporting wall 322 extends from the intermediate plate 321, and the layered body 20 is sandwiched between the supporting wall 322 and a side plate 324 of the upper case 32. A spring 323 is sandwiched between the layered body 20 and the supporting wall 322. The spring 323 applies pressure to the layered body 20 in a layered direction. The pressure allows the power modules and the cooling units 28 of the layered body 20 to tightly contact each other, securing a high cooling performance of the power modules.

A control board 29 is also fixed to the intermediate plate 321 of the upper case 32. Note that the control board 29 is disposed outside of the upper case 32. The control board 29 is covered with the upper cover 31. Maintenance including replacement of the control board 29 can be performed by removing the upper cover 31. Control terminals 11d extending from the power modules are connected to the control board 29. The control terminals 11d are gate terminals conducting with gate electrodes of switching elements housed in the power modules or sensor terminals conducting with a temperature sensor that measures the temperature of the switching elements. The control board 29 is mounted with a control circuit that controls the switching elements housed in the power modules. The control circuit transmits a drive signal to the switching elements via control terminals 11d.

Capacitor elements corresponding to the smoothing capacitor 6 illustrated in FIG. 1 are included in a capacitor module 60. The capacitor module 60 is also fixed to the upper case 32. As illustrated in FIG. 4, a supporting portion 326 extends from the inner wall of the upper case 32, and a tab 62 of the capacitor module 60 is fixed to the distal end of the supporting portion 326 via a bolt 75. The capacitor module 60 and the positive terminal 11a of the power module 8a are connected to each other via the positive bus bar 21 described above, and the capacitor module 60 and the negative terminal 11b are connected to each other via the negative bus bar 22 described above. Although not visible in the figures, the positive terminals 11a of the power modules 8b to 8g are connected to the capacitor module 60 via the positive bus bar 21. The negative terminals 11b of the power modules 8b to 8g are also connected to the capacitor module 60 via the negative bus bar 22.

The connection terminals 23 conducting with the midpoint terminals of the power modules 8b to 8g are supported by a terminal block 40. Each of the connection terminals 23 is connected to a corresponding one of the terminals on the connector side of the power cables 87 (see FIG. 1) connected at the through hole 331. The terminal block 40 is attached to a supporting portion 325 extending from the inner wall of the upper case 32. Tabs 41 are provided at opposite ends of the terminal block 40, and the tabs 41 are fixed to the supporting portion 325 (the upper case 32) via bolts 74.

As described above, the layered body 20 of the power modules, the capacitor module 60, the control board 29, and the terminal block 40 are fixed to the upper case 32. Meanwhile, the reactor 7 and the voltage converter 89 are fixed to the lower case 33. As already described, the reactor 7 is one of the components of the voltage converter circuit 12. The voltage converter 89 is a device that drops the voltage of the power of the battery 81 and supplies the dropped power to an auxiliary device. The auxiliary device is a generic name of on-vehicle electrical devices driven with a voltage lower than that of the motors 83a, 83b for traveling.

As described above with reference to FIG. 1, one end of the reactor 7 is connected with the midpoint terminal 11c of the power module 8a. One of the two components to be electrically connected (power module 8a) is fixed to the upper case 32, and the other of the two components to be electrically connected (reactor 7) is fixed to the lower case 33. Both components need to be electrically connected after the upper case 32 and the lower case 33 are coupled to each other. As viewed from the outside of the case 30, the connecting portion 3 of power module 8a and the reactor 7 is disposed so as to be entirely visible from the through hole 331 provided in the lower case 33.

One end of a first bus bar 24 is connected to the midpoint terminal 11c of the power module 8a. The other end of the first bus bar 24 is attached to the terminal block 40. A current sensor 44 that measures current flowing through the first bus bar 24 is installed in the terminal block 40. A current sensor (not illustrated) that measures current flowing through the six connection terminals 23 (that is, current supplied to the motors 83a, 83b) is also installed in the terminal block 40. A sensor terminal 441 that transmits data measured by the current sensors is connected to the control board 29.

The other end of the first bus bar 24 is exposed on the surface of the terminal block 40 on the through hole 331 side. Meanwhile, one end of a second bus bar 25 extending from the reactor 7 overlaps the other end of the first bus bar 24 on the surface of the terminal block 40 on the through hole 331 side. The other end of the first bus bar 24 and the one end of the second bus bar 25 is jointly fastened to the terminal block 40 via a bolt 73. Jointly fastening the first bus bar 24 and the second bus bar 25 enables electrical connection between each other. The fastening position of the bolt 73 functions as the connecting portion 3 of the first bus bar 24 and the second bus bar 25. The connecting portion 3 of the other end of the first bus bar 24 and the one end of the second bus bar 25 is disposed so as to be entirely visible from the through hole 331 as viewed from the outside of the case 30.

A female thread (a thread groove) that threadedly engages with the bolt 73 is formed in the connecting portion 3. The bolt 73 is inserted into the connecting portion 3 from the outside of the case 30 via the through hole 331. A tool that fastens the bolt 73 is inserted via the through hole 331 so as to connect the other end of the first bus bar 24 and the one end of the second bus bar 25. The first bus bar 24 and the second bus bar 25 can be easily electrically connected via the through hole 331 after the upper case 32 and the lower case 33 are coupled to each other.

A shield 332 is provided inside the lower case 33 such that a part of the shield 332 can be seen via the through hole 331. The shield 332 narrows the clearance on the inner side of the through hole 331 such that the bolt 73 does not accidently fall inside the lower case 33 when the bolt 73 is fixed to the terminal block 40. The function of the shield 332 is described with reference to FIG. 5.

Figure 5:
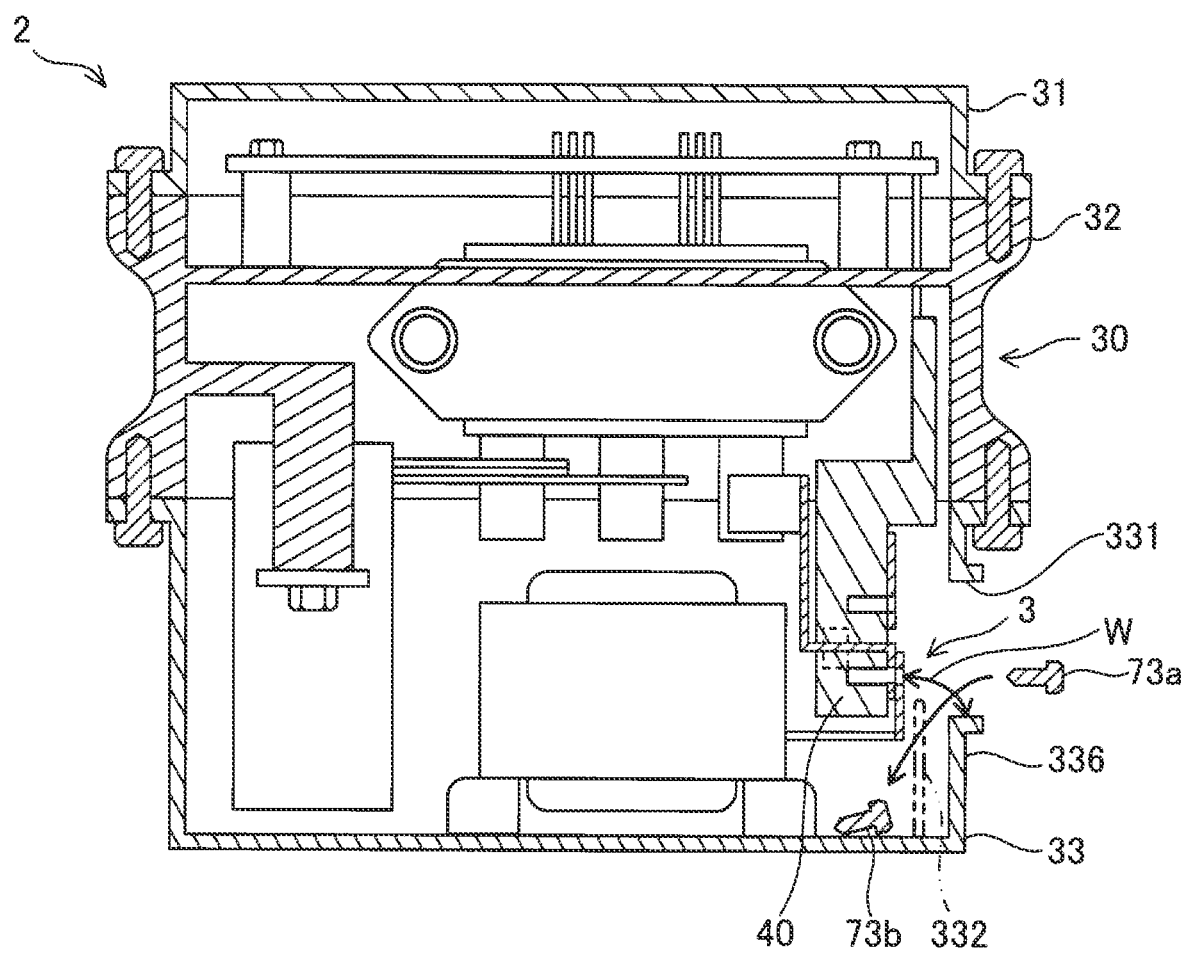
FIG. 5 is a view illustrating a role of a shield.

FIG. 5 illustrates the same view as FIG. 4 except that only reference signs necessary for describing the shield 332 are shown. In FIG. 5, the shield 332 is denoted with an imaginary line. The shield 332 is provided to narrow the clearance between one component and another component (or, between one component and the through hole 331) on the inner side of the through hole 331. The clearance W between a lower end of the through hole 331 and the terminal block 40 is larger than a width of a bolt-head of the bolt 73 that connects the first bus bar 24 and the second bus bar 25. Without the shield 332, the bolt 73 may fall inside the lower case 33 in the case of fastening failure. In FIG. 5, a reference sign 73a denotes the bolt 73 before being inserted in the through hole 331, and the reference sign 73b denotes the bolt 73 after falling inside the lower case 33. The shield 332 is disposed so as to block the falling path (denoted by a bold arrow line in FIG. 5) of the bolt 73. The shield 332 narrows a clearance width around the connecting portion 3 on the inner side of the through hole 331 down to such a width that the bolt-head of the bolt 73 does not pass through the clearance. The shield 332 suppresses the bolt 73 from accidentally falling inside the lower case 33.

Figure 6:
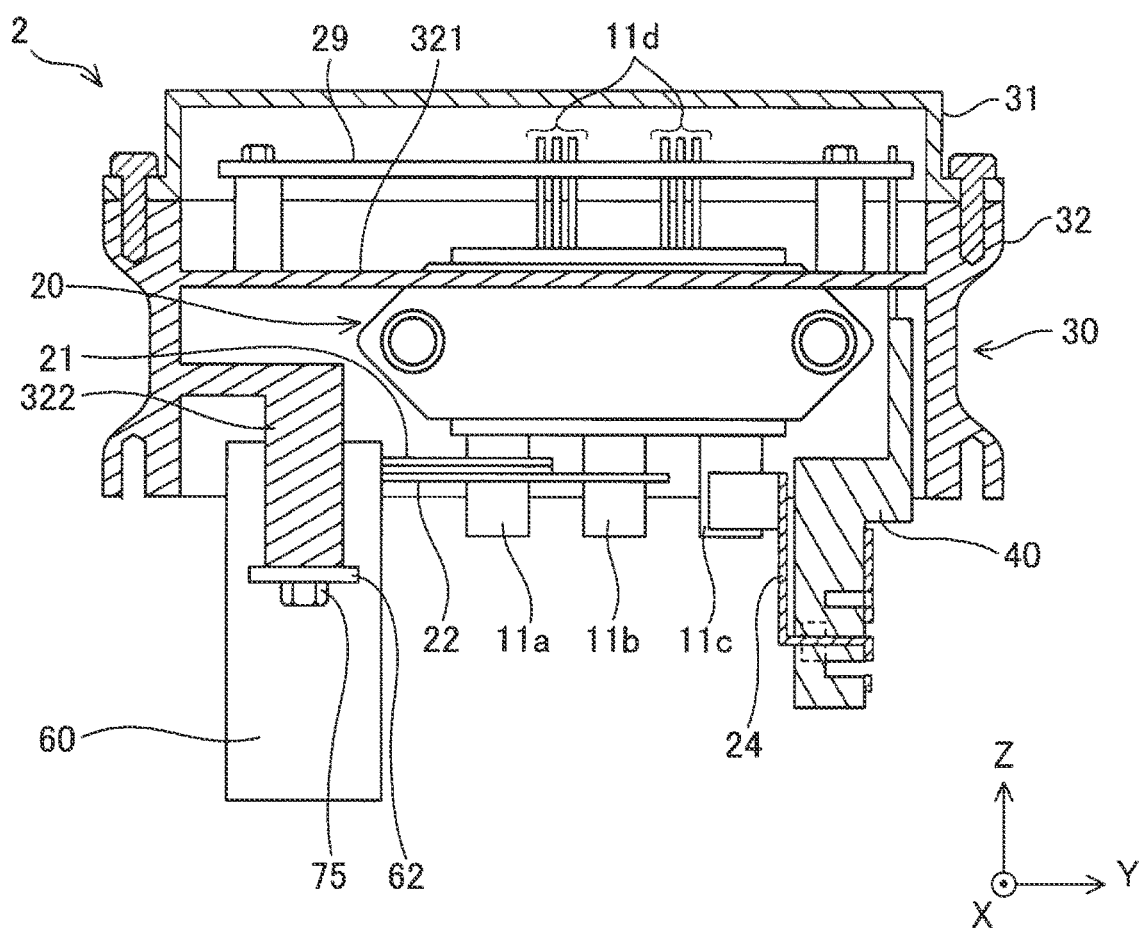
FIG. 6 is a sectional view of an upper case before being coupled to a lower case.
Figure 7:
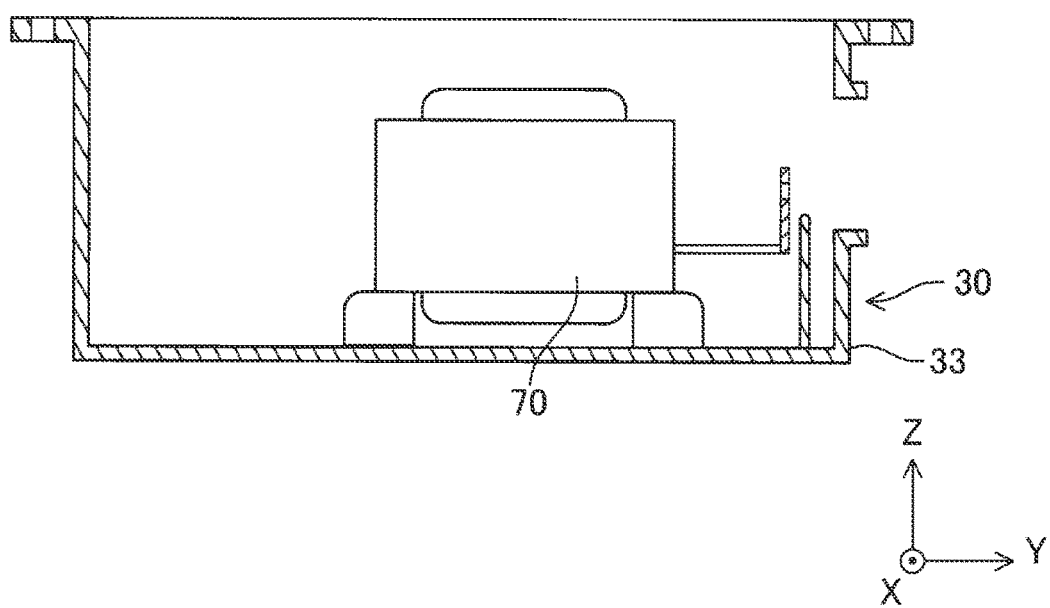
FIG. 7 is a sectional view of the lower case before being coupled to the upper case.
Figure 8:
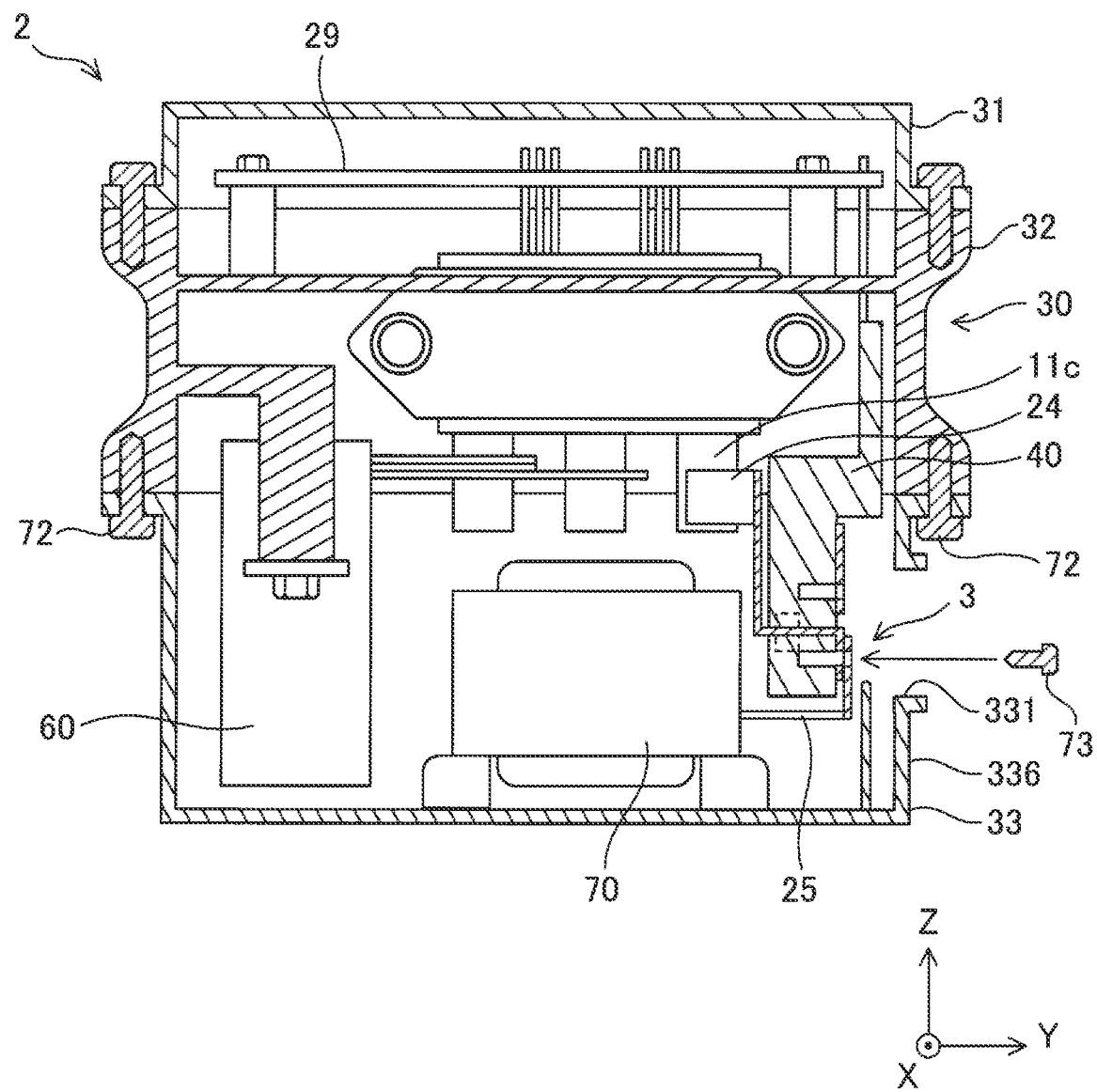
FIG. 8 is a sectional view of the case after the upper case is coupled to the lower case.

Next, a manufacturing method of the power converter 2 is described with reference to FIGS. 6 to 8. FIG. 6 is a sectional view of the upper case 32 before being coupled to the lower case 33. FIG. 7 is a sectional view of the lower case 33 before being coupled to the upper case 32. FIG. 8 is a sectional view of the case 30 after the lower case 33 is coupled to the upper case 32.

Component Mounting Process

The layered body 20, the terminal block 40, and the capacitor module 60 are fixed to the upper case 32 (FIG. 6). The midpoint terminal 11c of the power module 8a is connected to one end of the first bus bar 24, and the other end of the first bus bar 24 is fixed to the terminal block 40. The positive terminal 11a and the negative terminal 11b of the power module 8a are connected to the capacitor module 60 via the positive bus bar 21 and the negative bus bar 22, respectively. The positive terminals and the negative terminals of the other power modules 8b to 8g are also connected to the capacitor module 60 via the positive bus bar 21 and the negative bus bar 22. In FIG. 6, the upper cover 31 is coupled to the upper case 32 after the control board 29 is fixed to the upper case 32.

The reactor 7 and the voltage converter 89 (not illustrated) are fixed to the lower case 33 (FIG. 7). FIG. 7 illustrates the second bus bar 25 extending from the reactor 7 before being connected to the other components.

Case Coupling Process

The lower case 33 is coupled to the upper case 32 (FIG. 8). As described above, the upper case 32 is coupled to the lower case 33 via the bolts 72. The other end of the first bus bar 24 extending from the power module 8a and the one end of the second bus bar 25 extending from the reactor 7 overlap on the surface of the terminal block 40 facing the through hole 331.

Conductor Connecting Process

The bolt 73 is inserted into the connecting portion 3 via the through hole 331 such that the bolt 73 jointly fastens the first bus bar 24 and the second bus bar 25 to the terminal block 40, thereby electrically connecting the first bus bar 24 and the second bus bar 25. As described above, the operator fixing the bolt 73 (or a tool fastening the bolt 73) can easily access the connecting portion 3 via the through hole 331.

Thus, the first bus bar 24 extending from the power module 8a that is fixed to the upper case 32 and the second bus bar 25 extending from the reactor 7 that is fixed to the lower case 33 can be connected with bolts 73 from outside the case 30 via the through hole 331 provided in the lower case 33. The power converters 2a to 2d described later can also be manufactured using the above method.

Some characteristics of the technique described in the first embodiment are listed below. The case 30 of the power converter 2 includes the upper cover 31, the upper case 32, and the lower case 33. The layered body 20 including the power module 8a, the capacitor module 60, the control board 29, and the terminal block 40 are fixed to the upper case 32. The reactor 7 and the voltage converter 89 are fixed to the lower case 33. The lower case 33 is provided with the through hole 331 that communicates the inside and the outside of the case 30. The upper case 32 and the lower case 33 are coupled to each other to configure the case 30. The first bus bar 24 extending from the power module 8a and the second bus bar 25 extending from the reactor 7 are electrically connected at the connecting portion 3 that is disposed so as to be entirely visible from the through hole 331 as viewed from the outside of the case 30. The power module 8a fixed to the upper case 32 and the reactor 7 fixed to the lower case 33 can be electrically connected via the through hole 331 after the upper case 32 and the lower case 33 are coupled to each other.

The power converter 2 is a device that converts the power of a power source to a power to drive the motors 83a, 83b for traveling. The power module 8a is a device that houses the switching elements included in the voltage converter circuit 12. The voltage converter circuit 12 boosts the voltage of the battery 81. The reactor 7 is a component included in the voltage converter circuit 12.

The through hole 331 functions as a mounting port for the connectors of the power cables 87. The power cables 87 connect the power converter 2 and the motors 83a, 83b. The first bus bar 24 and the second bus bar 25 can be connected using the mounting port for the connector. Thus, a through hole dedicated for connecting the first bus bar 24 and the second bus bar 25 is not necessary. The connecting portion 3 of the first bus bar 24 and the second bus bar 25 is provided in the terminal block 40. The terminal block 40 supports the terminals connected to the connectors attached via the through hole 331. The connecting portion 3 is provided in an existing component, and thus can be provided at low cost.

The first bus bar 24 and the second bus bar 25 can be easily connected with the bolt 73. The lower case 33 including the through hole 331 is provided with the shield 332 that narrows a clearance width around the connecting portion 3 on the inner side of the through hole 331 down to a width that does not allow the bolt-head of the bolt 73 to pass through the clearance. The shield 332 prevents the bolt 73 from accidentally falling into the deep side of the lower case 33 in the case of fastening failure.

The lower case 33 is disposed below the upper case 32, and the voltage converter 89 is fixed to the lower case 33 along with the reactor 7. The voltage converter 89 drops the voltage of the power of the battery 81. The power of the battery 81 with dropped voltage is supplied to the auxiliary device. The voltage converter 89 that drops the voltage of the battery 81 from more than 100 volts to 10 to 50 volts, and the reactor 7 through which a power of more than 100 volts of the battery 81 flows are both relatively heavy electrical parts. Disposing the relatively heavy electrical parts in the lower case (the lower case 33) lowers a center of gravity of the entire power converter 2, thus improving the stability of the case 30 of the power converter 2.

The top and bottom of the upper case 32 are open. The control board 29 that controls the power module 8*a* is fixed to the upper part of the upper case 32. The control board 29 is disposed so as to be visible from the upper opening of the upper case 32. The upper opening of the upper case 32 is covered with the upper cover 31. The control board 29 is exposed when the upper cover 31 is removed. Such a structure enhances the maintainability of the control board 29.

As described above, the voltage converter 89 is fixed to the lower case 33. The process of replacing the voltage converter 89 is described below. The bolt 73 is removed via the through hole 331, and the first bus bar 24 and the second bus bar 25 are removed from the connecting portion 3. Next, the bolts 72 fixing the upper case 32 and the lower case 33 to each other are removed. The lower case 33 is separated from the upper case 32 such that the upper opening of the lower case 33 is exposed. Cables (not illustrated) connecting the voltage converter 89 and other devices (not illustrated) are disconnected, and the voltage converter 89 is taken out of the lower case 33. A new voltage converter 89 is placed in the lower case 33. The new voltage converter 89 is electrically connected to the other devices. The upper case 32 is attached to the lower case 33 and fixed to each other via the bolts 72. The first bus bar 24 and the second bus bar 25 are connected at the connecting portion 3 via the through hole 331. When replacing the voltage converter 89, the control board 29 housed in the upper case 32 does not need to be removed.

The manufacturing method of the power converter 2 includes the component mounting process, the case coupling process, and the conductor connecting process. In the component mounting process, the layered body 20 including the power module 8*a* is fixed to the upper case 32, and the reactor 7 is fixed to the lower case 33. In the case coupling process, the upper case 32 is coupled to the lower case 33. In the conductor connecting process, the first bus bar 24 extending from the power module 8*a* and the second bus bar 25 extending from the reactor 7 are connected by inserting a tool inside the case 30 via the through hole 331.

Second Embodiment

Figure 9:
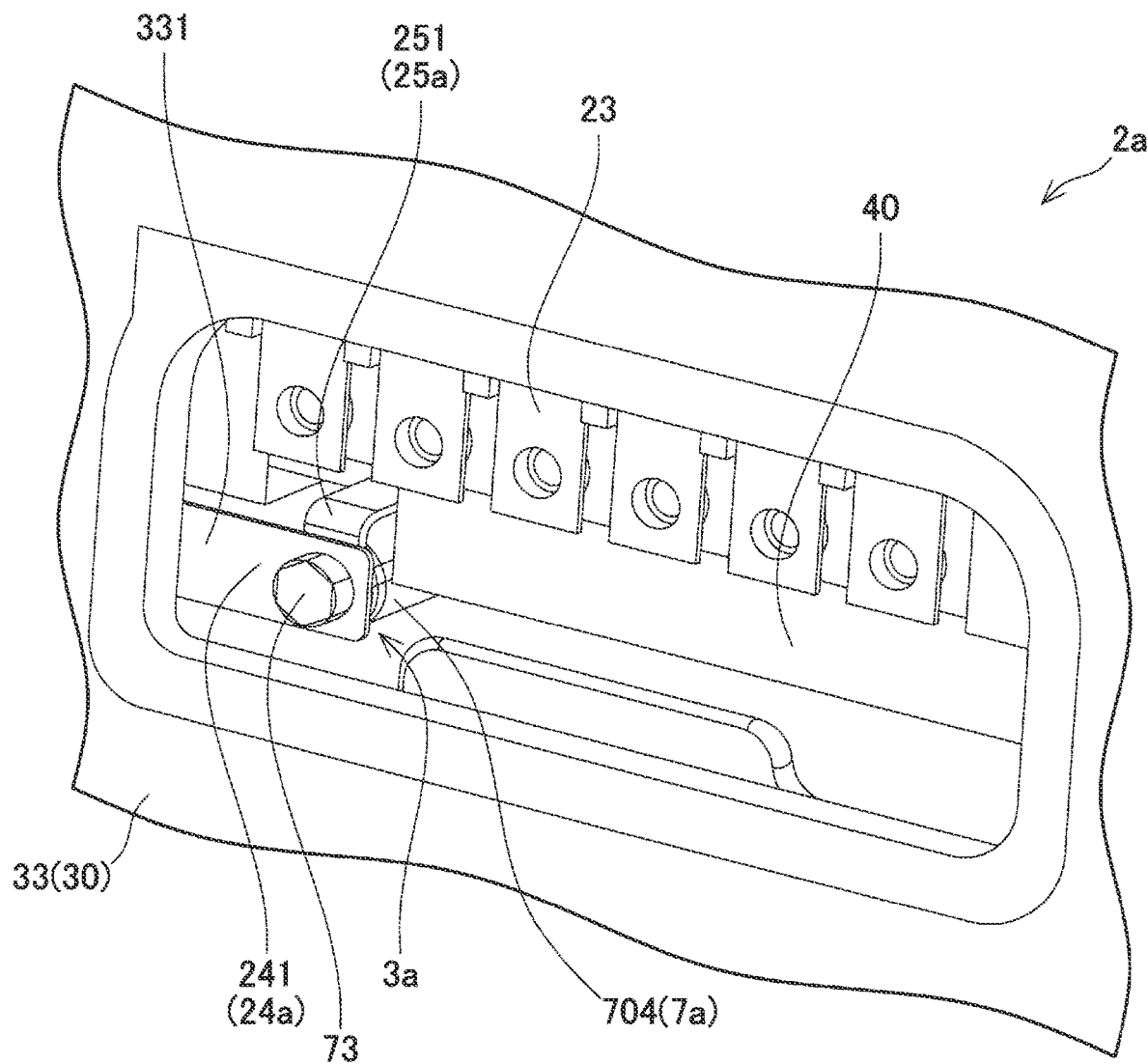
FIG. 9 is an enlarged view illustrating a periphery of a through hole in the power converter according to a second embodiment.
Figure 9:
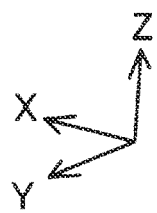

The power converter 2*a* according to a second embodiment is described with reference to FIGS. 9 to 11. In the power converter 2 according to the first embodiment described above, the connecting portion 3 of the midpoint terminal 11*c* of the power module 8*a* and the reactor 7 are provided in the terminal block 40. In the power converter 2*a* according to the second embodiment, a connecting portion is provided in the reactor. FIG. 9 illustrates a periphery of the through hole 331 of the power converter 2*a*. As with the power converter 2 according to the first embodiment, the through hole 331 is provided in the side surface of the lower case 33 of the power converter 2*a*. Although not illustrated, as with the power converter 2 according to the first embodiment, a layered body including the layered power modules 8*a* to 8*g* is housed in the upper case of the power converter 2*a*.

The terminal block 40 to which a plurality of connection terminals 23 is fixed is disposed so as to be visible from the through hole 331 as viewed from the outside of the case 30. A part of a reactor 7*a* (a protrusion 704) is disposed below the terminal block 40 so as to be visible from the through hole 331 as viewed from the outside of the case 30. One end 241 of the first bus bar 24*a* and one end 251 of the second bus bar 25*a* are fixed to the protrusion 704 via a bolt 73. That is, the protrusion 704 forms the connecting portion 3*a* of the first bus bar 24*a* and the second bus bar 25*a*. Although not illustrated in FIG. 9, as with the power converter 2 according to the first embodiment, the other end of the first bus bar 24*a* is connected to the midpoint terminal 11*c* of the power module 8*a*, and the other end of the second bus bar 25*a* is connected to the reactor 7*a*.

The connecting portion 3*a* of the first bus bar 24*a* and the second bus bar 25*a* is disposed so as to be entirely visible from the through hole 331 as viewed from the outside of the case 30, such that the bolt 73 can be fixed to the protrusion 704 via the through hole 331.

Figure 10:
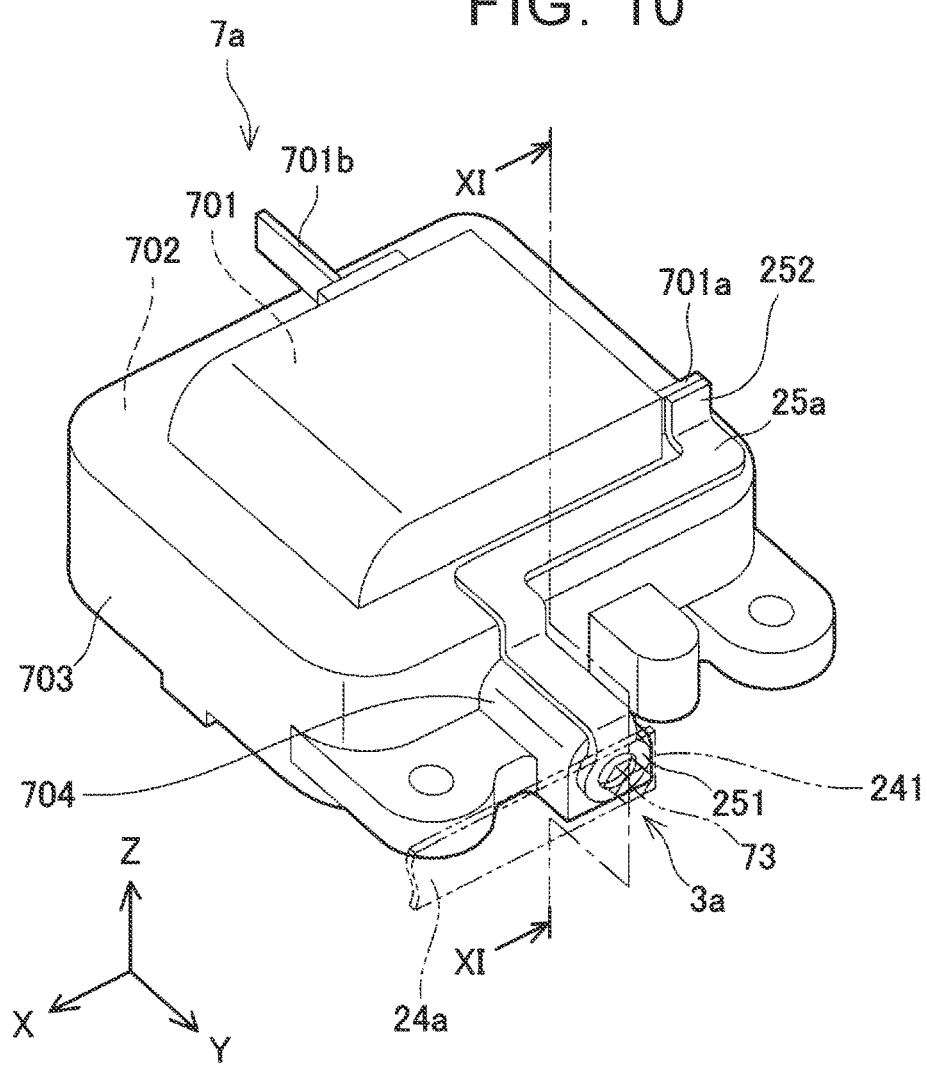
FIG. 10 is a perspective view of a reactor according to the second embodiment.

FIG. 10 illustrates a perspective view of the reactor 7*a*. FIG. 11 illustrates a sectional view taken along a line XI-XI in FIG. 10. In FIG. 10, to facilitate understanding, the first bus bar 24*a* and the bolt 73 are denoted with imaginary lines.

The reactor 7*a* includes a resin cover 703 that covers a coil 701 and a core 702. In FIG. 10, the coil 701 and the core 702 are hidden by the resin cover 703 and thus are not visible. Terminals of the coil 701 (reactor terminals 701*a*, 701*b*) extend from the resin cover 703. The protrusion 704 is provided in the resin cover 703. The protrusion 704 protrudes from the resin cover 703 in the horizontal direction. The protrusion 704 is a part of the resin cover 703 and made of resin.

As illustrated in FIG. 10, the other end 252 of the second bus bar 25*a* and the reactor terminal 701*a* are welded to each other. Although not illustrated, a different bus bar is connected to the reactor terminal 701*b*. The one end 251 of the second bus bar 25*a* is disposed at the distal end of the protrusion 704.

Figure 11:
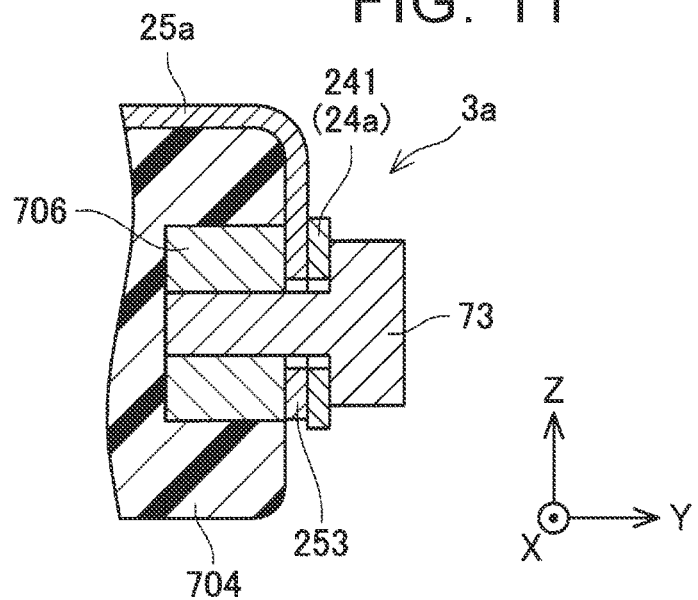
FIG. 11 is a sectional view taken along a line XI-XI in FIG. 10.

As illustrated in FIGS. 10 and 11, the one end 251 of the second bus bar 25*a* and the one end 241 of the first bus bar 24*a* overlap with each other. A nut 706 (a female thread) is embedded in the protrusion 704 (see FIG. 11). The bolt 73 inserted through the one end 241 of the first bus bar 24*a* and the one end 251 of the second bus bar 25*a* threadedly engages with the nut 706, such that the first bus bar 24*a* and the second bus bar 25*a* are fixed to the protrusion 704. The connecting portion 3*a* is thus formed.

The bolt 73 fixed to the protrusion 704 of the reactor 7*a* is detachable via the through hole 331. In the power converter 2*a* according to the second embodiment, the electrical parts housed in separate case portions can be electrically connected with good work efficiency. The structure described above reduces the number of components and improves productivity.

The other configurations of the power converter 2*a* according to the second embodiment are the same as those of the power converter 2 according to the first embodiment.

The power converter 2a according to the second embodiment has the same advantages as the power converter 2 according to the first embodiment.

Third Embodiment

An electrical device according to a third embodiment is described with reference to FIGS. 12 to 14. The electrical device according to the third embodiment is a power converter as is the case with the first embodiment. A power converter 2b according to the third embodiment includes a plurality of reactors.

Figure 12:
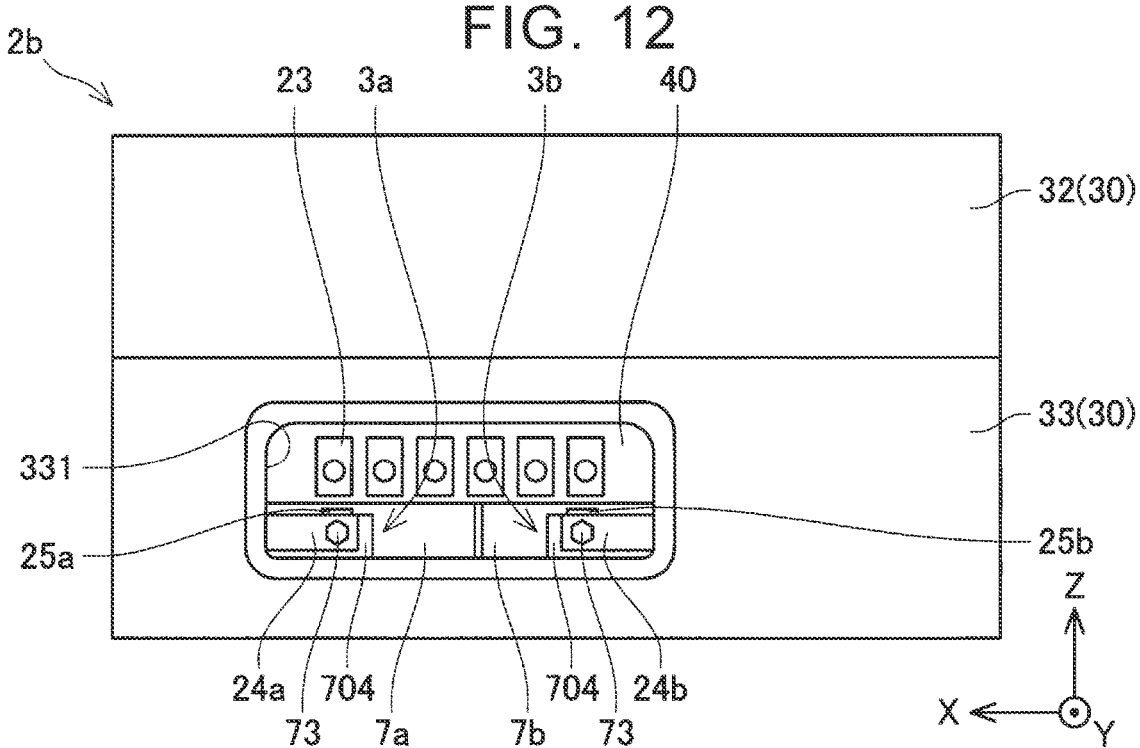
FIG. 12 is a lateral view illustrating an electrical device (power converter) according to a third embodiment.

FIG. 12 illustrates a lateral view of the power converter 2b. The case 30 of the power converter 2b includes the upper case 32 and the lower case 33. Although not illustrated, a layered body including layered power modules 8a to 8g is housed in the upper case 32, as with the power converter 2 according to the first embodiment.

The through hole 331 is provided in the side surface of the lower case 33. A part of the terminal block 40 is disposed so as to be visible from the through hole 331 as viewed from the outside of the case 30. The six connection terminals 23 conducting with the midpoint terminals 11c of the power modules 8b to 8g are fixed to the terminal block 40. The connection terminals 23 are also disposed so as to be visible from the through hole 331 as viewed from the outside of the case 30.

The reactors 7a, 7b are disposed below the terminal block 40. A part of each reactor 7a, 7b (protrusion 704) is also disposed so as to be visible from the through hole 331 as viewed from the outside of the case 30.

The first bus bar 24a and the second bus bar 25a are fixed to the protrusion 704 of the reactor 7a via a bolt 73. Thus, the protrusion 704 of the reactor 7a forms the connecting portion 3a of the first bus bar 24a and the second bus bar 25a. The connecting portion 3a of the first bus bar 24a and the second bus bar 25a is disposed so as to be entirely visible from the through hole 331 as viewed from the outside of the case 30. Although not illustrated in FIG. 12, the other end of the first bus bar 24a is connected to the midpoint terminal 11c of the power module 8a, and the other end of the second bus bar 25a is connected to the terminal of the coil of the reactor 7a.

A first bus bar 24b and a second bus bar 25b are fixed to the protrusion 704 of a reactor 7b via the bolt 73. That is, the protrusion 704 of the reactor 7b forms a connecting portion 3b of the first bus bar 24b and the second bus bar 25b. The connecting portion 3b of the first bus bar 24b and the second bus bar 25b is disposed so as to be entirely visible from the through hole 331 as viewed from the outside of the case 30. Although not illustrated in FIG. 12, the other end of the first bus bar 24b is connected to the midpoint terminal 11c of the power module 8a, and the other end of the second bus bar 25b is connected to the coil terminal of the reactor 7b.

Figure 13:
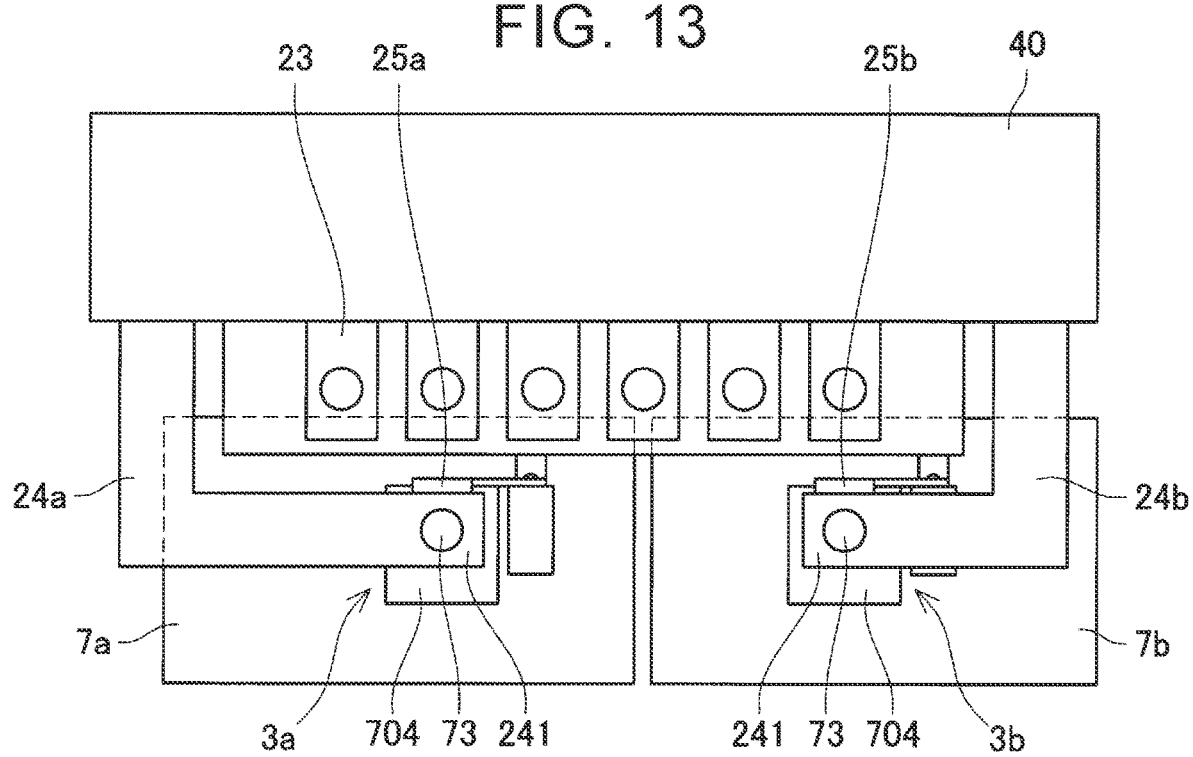
FIG. 13 is a lateral view of a terminal block and the reactors according to the third embodiment.

FIG. 13 illustrates a lateral view of the terminal block 40 and the reactors 7a, 7b. A main body of the terminal block 40 is made of resin. The two first bus bars 24a, 24b pass through the main body of the terminal block 40 and are supported by the terminal block 40. A plurality of connection terminals 23 is disposed in the terminal block 40 in a row. The two first bus bars 24a, 24b extend inward from each end of the row of connection terminals 23 in the direction in which that row is aligned (an X direction of the coordinate in FIG. 13). Each of one ends 241 of the first bus bars 24a, 24b are disposed further inward of the ends of the row of connection terminals 23 in the direction in which that row is aligned. The one end 241 of the first bus bar 24a and the second bus bar 25a are fixed to the protrusion 704 of the reactor 7a, thereby forming the connecting portion 3a. The one end 241 of the first bus bar 24b and the second bus bar 25b are fixed to the protrusion 704 of the reactor 7b, thereby forming the connecting portion 3b.

Figure 14:
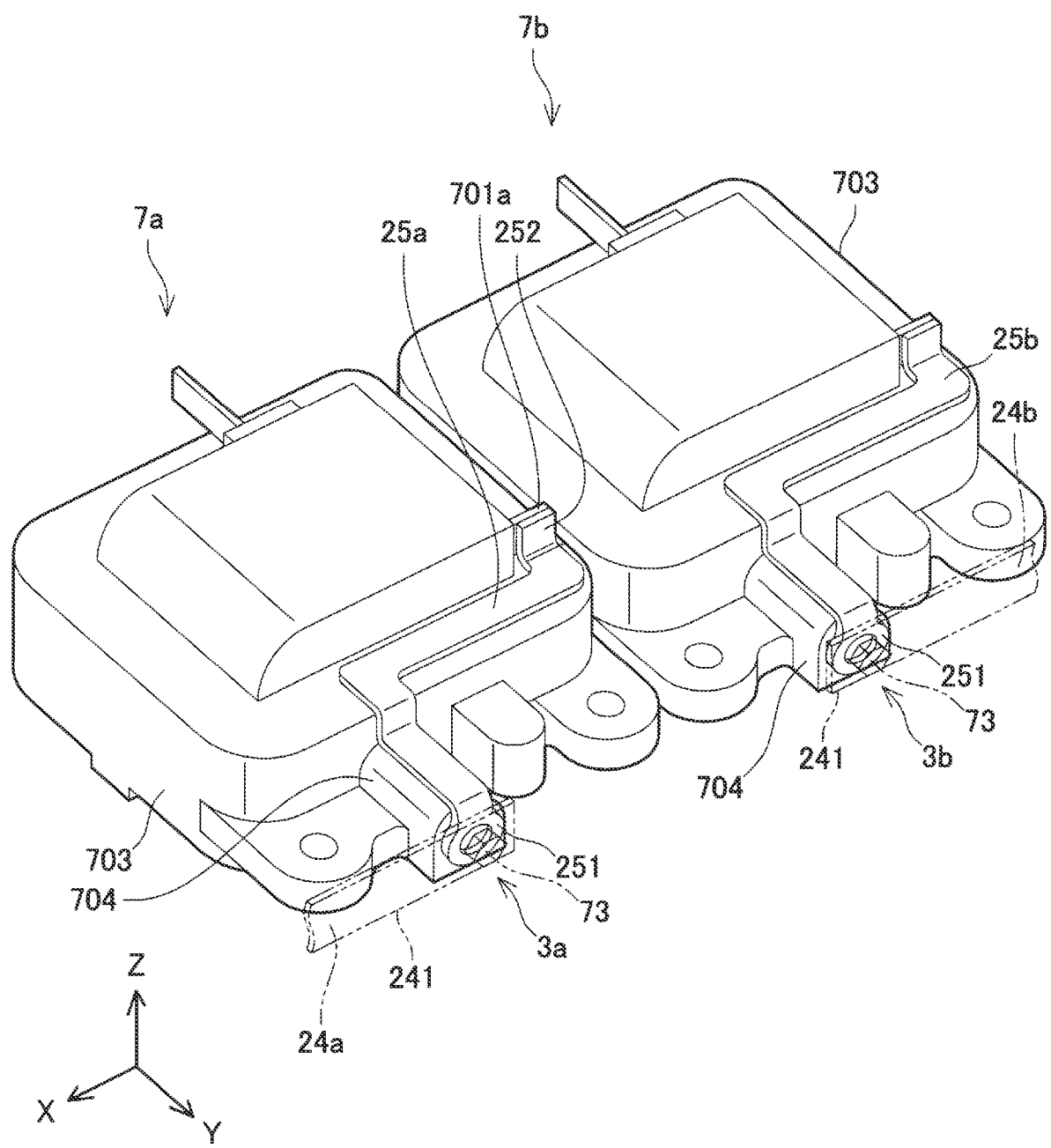
FIG. 14 is a perspective view of the two reactors.

FIG. 14 illustrates a perspective view of the two reactors 7a, 7b. In FIG. 14, to facilitate understanding, the first bus bars 24a, 24b and the bolts 73 are denoted with imaginary lines. Each of the two reactors 7a, 7b has a configuration similar to the reactor 7a of the power converter 2a according to the second embodiment. The protrusion 704 is provided in the resin cover 703 included in the reactor 7a. A nut (a female thread) is embedded in the protrusion 704. The one end 241 of the first bus bar 24a and the one end 251 of the second bus bar 25a are fixed to the protrusion 704 via the bolt 73. The one ends 241, 251, the protrusion 704, and the bolt 73 are included in the connecting portion 3a. The other end 252 of the second bus bar 25a and the coil terminal of the reactor 7a (the reactor terminal 701a) are welded to each other.

As with the reactor 7a, the one end 241 of the first bus bar 24b and the one end 251 of the second bus bar 25b are fixed to the protrusion 704 of the reactor 7b, thereby forming the connecting portion 3b.

The bolts 73 fixed to the protrusions 704 of the reactors 7a, 7b are detachable via the through hole 331. In the power converter 2b according to the third embodiment, the electrical parts housed in separate case portions can be electrically connected with good work efficiency. Furthermore, the structure described above reduces the number of components and improves productivity.

The other configurations of the power converter 2b according to the third embodiment are the same as those of the power converter 2 according to the first embodiment. The power converter 2b according to the third embodiment has the same advantages as the power converter 2 according to the first embodiment.

Fourth Embodiment

Figure 15:
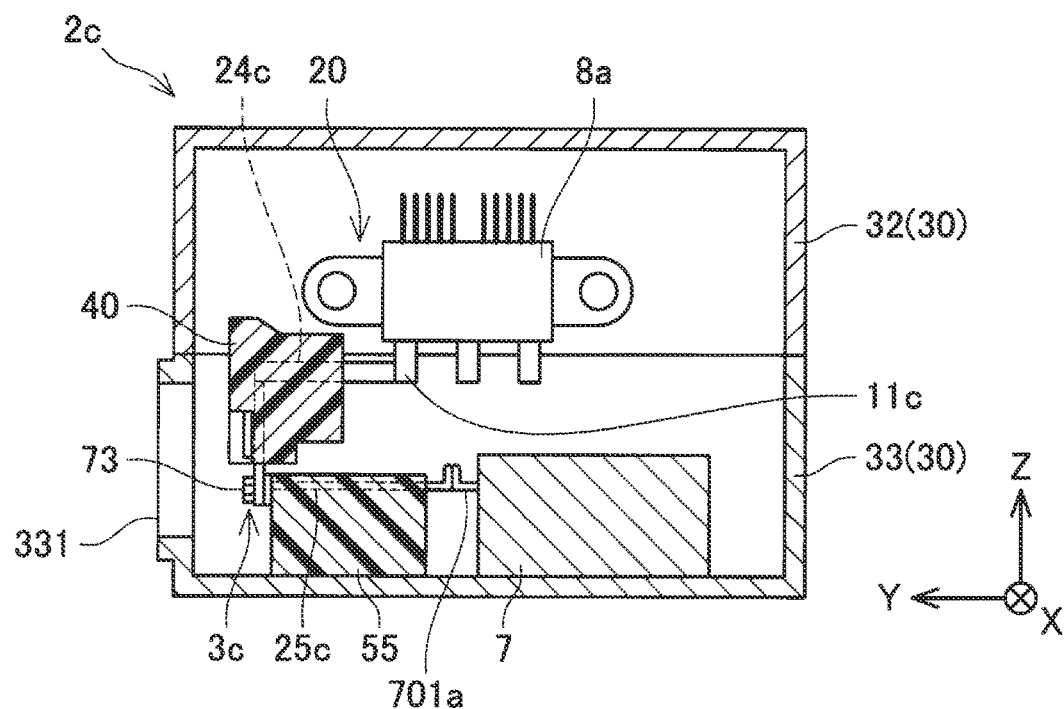
FIG. 15 is a sectional view of an electrical device (power converter) according to a fourth embodiment.

An electrical device according to a fourth embodiment is described with reference to FIG. 15. The electrical device according to the fourth embodiment is a power converter as is the case with the first to third embodiments. FIG. 15 is a sectional view of a power converter 2c according to the fourth embodiment. FIG. 15 illustrates components inside the power converter 2c in a simplified manner. In the power converter 2c illustrated in FIG. 15, the connecting portion 3c is provided in a relay terminal block 55 separately from the reactor 7.

The case 30 of the power converter 2c includes the upper case 32 and the lower case 33. The through hole 331 is provided in the side surface of the lower case 33. The layered body 20 formed of the power modules 8a to 8g is housed in the upper case 32. In FIG. 15, only the power module 8a is visible.

The relay terminal block 55 is made of a resin molding. A second bus bar 25c is embedded in the relay terminal block 55. Both ends of the second bus bar 25c are exposed from the relay terminal block 55. One end of the second bus bar 25c is connected to one end of the first bus bar 24c via a bolt 73. A connecting portion 3c of the first bus bar 24c and the second bus bar 25c is disposed so as to be entirely visible from the through hole 331 as viewed from the outside of the case 30. The other end of the second bus bar 25c and a terminal of the reactor 7 (the reactor terminal 701a) are welded to each other. The other end of the first bus bar 24*c* is connected to the midpoint terminal 11*c* of the power module 8*a*.

At least a part of the relay terminal block 55 and a part of the terminal block 40 are disposed so as to be visible from the through hole 331 as viewed from the outside of the case 30. A distal end of the first bus bar 24*c* and a distal end of the second bus bar 25*c* overlap with each other on the surface of the relay terminal block 55, which faces the through hole 331. The first bus bar 24*c* and the second bus bar 25*c* that overlap with each other are fixed to the relay terminal block 55 via a bolt 73.

The other configurations of the power converter 2*c* according to the fourth embodiment are the same as those of the power converter 2 according to the first embodiment. The power converter 2*c* according to the fourth embodiment can also reduce the number of components and improve productivity with the configuration of the electrical connection of the first bus bar 24*c* and the second bus bar 25*c*. The power converter 2*c* (electrical device) according to the fourth embodiment has the same advantages as the power converter 2 (electrical device) according to the first embodiment.

Fifth Embodiment

Figure 16:
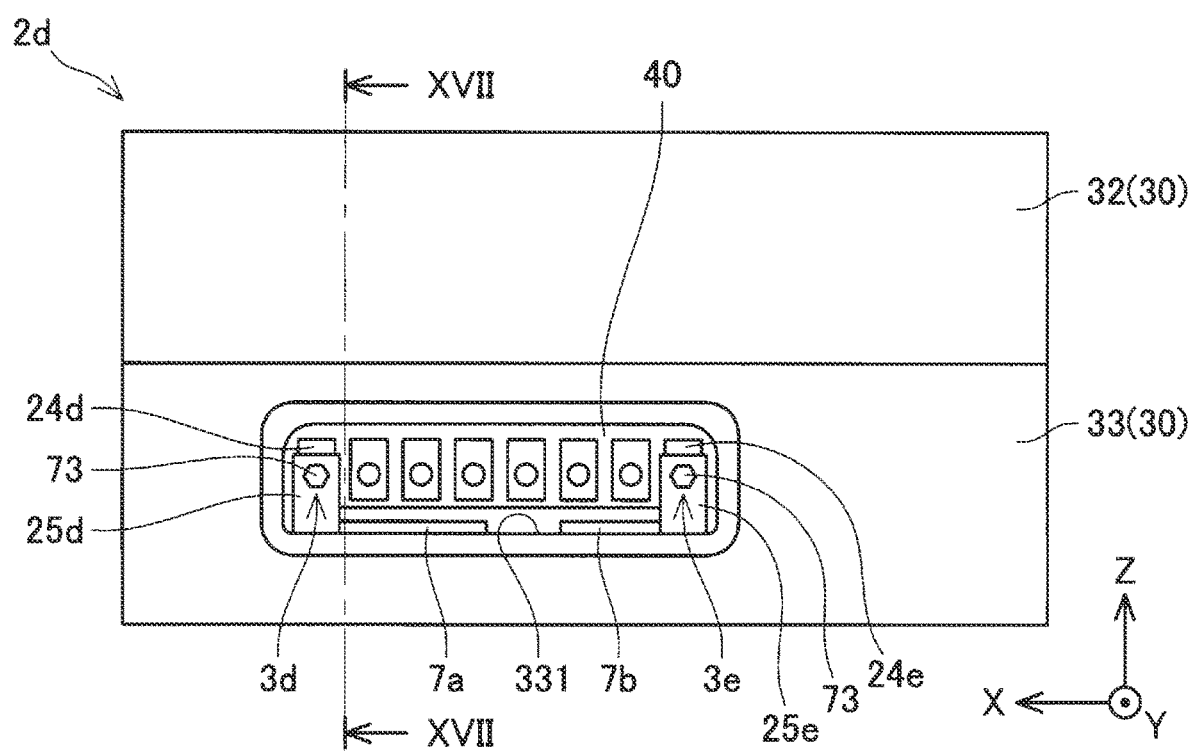
FIG. 16 is a lateral view of an electrical device (power converter) according to a fifth embodiment.
Figure 17:
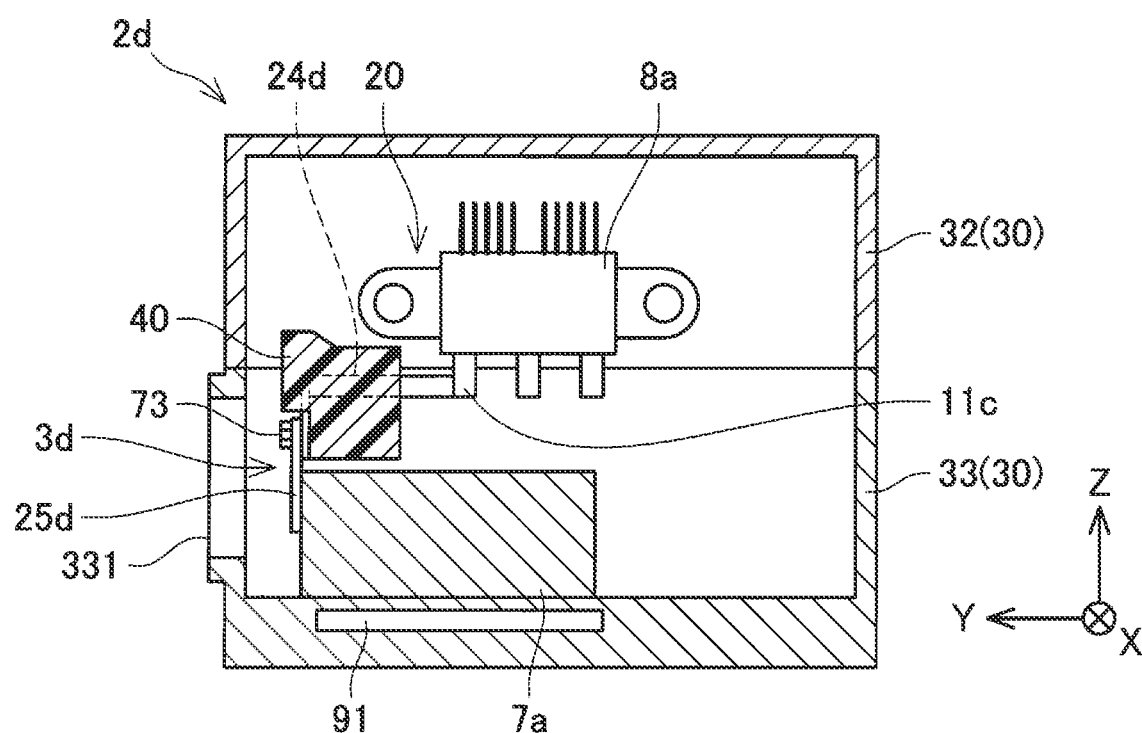
FIG. 17 is a sectional view taken along a line XVII-XVII in FIG. 16.

An electrical device according to a fifth embodiment is described with reference to FIGS. 16 and 17. The electrical device according to the fifth embodiment is a power converter as is the case with the first to fourth embodiments. FIG. 16 is a lateral view of a power converter 2*d*, and FIG. 17 is a sectional view taken along a line XVII-XVII in FIG. 16. The case 30 of the power converter 2*d* also includes the upper case 32 and the lower case 33. The through hole 331 is provided in the side surface of the lower case 33. The layered body 20 formed of the power modules 8*a* to 8*g* is housed in the upper case 32. In FIG. 16, only the power module 8*a* is visible.

As with the power converter 2*a* according to the second embodiment, the power converter 2*d* also includes two reactors 7*a*, 7*b*. In the power converter 2*d*, a connecting portion 3*d* of a first bus bar 24*d* and a second bus bar 25*d* is provided in an output terminal block 40, as illustrated in FIGS. 16 and 17. The second bus bar 25*d* extends from the reactor 7*a*. That is, the connecting portion 3*d* that electrically connects the power module 8*a* and the reactor 7*a* is provided in the output terminal block 40. A connecting portion 3*e* of another first bus bar 24*e* and another second bus bar 25*e* is provided in the output terminal block 40. The second bus bar 25*e* extends from the reactor 7*b*. That is, the connecting portion 3*e* that electrically connects the power module 8*a* and the reactor 7*b* is provided in the terminal block 40.

In the power converter 2*d* according to the fifth embodiment, the connecting portion 3*d* of the first bus bar 24*d* and the second bus bar 25*d*, as well as the connecting portion 3*e* of the other first bus bar 24*e* and the other second bus bar 25*e* are exposed on the surface of the terminal block 40. The connecting portions 3*d*, 3*e* are disposed so as to be entirely visible from the through hole 331 as viewed from the outside of the case 30.

One end of the first bus bar 24*d* conducting with the midpoint terminal 11*c* of the power module 8*a* and one end of the second bus bar 25*d* conducting with the reactor 7*a* overlap with each other so that the overlapping portion is entirely visible from the through hole 331 as viewed from the outside of the case 30, and are fixed to the terminal block 40 via a bolt 73. A nut (not illustrated) that threadedly engages with the bolt 73 is embedded in the terminal block 40. The same applies to the other first bus bar 24*e* and the other second bus bar 25*e*.

The second bus bar 25*d* may be a lead wire of a coil of the reactor 7*a* and may be a conducting member electrically connected to the lead wire of the coil. The same applies to the other second bus bar 25*e*. The other configurations of the power converter 2*d* according to the fifth embodiment are the same as those of the power converter 2 according to the first embodiment.

The reactors 7*a*, 7*b* are fixed to the bottom plate of the lower case 33. A cooling unit 91 is provided in the bottom plate of the lower case 33. The cooling unit 91 is disposed so as to face the reactors 7*a*, 7*b*. The cooling unit 91 has a flow path through which a refrigerant flows. The reactors 7*a*, 7*b* are cooled by the cooling unit 91.

Other characteristics of the embodiments are listed below. The protrusion 704 of the reactor 7*a* is provided with the female thread (the nut 706) that threadedly engages with the bolt 73 connecting the first bus bar 24*a* and the second bus bar 25*a* (see FIG. 11). The protrusion 704 (the connecting portion 3*a*) extends from the reactor 7*a* towards the through hole 331, which reduces the distance between the connecting portion 3*a* and the edge of the through hole 331. This structure can further reduce the possibility that the bolt 73 falls into the case.

The reactor 7 is disposed below the cooling unit 28 and the layered body 20 of the power modules (FIG. 4). This structure enables the reactor 7 to be cooled by the cooling unit 28 of the layered body 20.

The connecting portion 3*a* of the first bus bar 24*a* and the second bus bar 25*a* is provided in the reactor 7*a*. At least a part of the reactor 7*a* is disposed so as to be visible from the through hole 331 as viewed from the outside of the case 30 (see FIG. 9). This structure can reduce the length of the second bus bar 25*a* that connects the connecting portion 3*a* and the reactor 7*a*.

The lower case 33 housing the reactor 7 is provided with the cooling unit 91 that cools the reactors 7*a*, 7*b* (FIG. 17). This structure cools the reactors 7*a*, 7*b*.

As illustrated in FIG. 4, the layered body 20 including the power modules and the cooling unit 28 is disposed between the reactor 7 and the control board 29. This structure allows the temperature of heat from the reactor 7 to decrease by the time the heat reaches the control board 29. Thus, the control board 29 is protected by the heat from the reactor 7.

As illustrated in FIG. 17, the reactor 7*a* is disposed in a position shifted from the center of the lower case 33. In other words, the center of gravity of the reactor 7*a* is deviated from the center of the bottom plate of the lower case 33. An end portion of the bottom plate of the lower case 33 has a rigidity higher than that of the center of the bottom plate. Placing the reactor 7*a* in a position with higher rigidity (a position closer to the side plates of the lower case 33) can suppress vibration occurring at the bottom of the lower case 33. Although not illustrated, the same applies to the reactor 7*b*.

As illustrated in FIG. 4, the reactor 7 is disposed between the terminal block 40 and the capacitor module 60 in the horizontal direction. Furthermore, the reactor 7 is disposed closer to the terminal block 40 than to the capacitor module 60. Generally, the terminal block 40 weighs less than the capacitor module 60, and the reactor 7 weighs more than the capacitor module 60. Placing the heavy reactor 7 closer to the light terminal block 40 can reduce deviation with respect to the weight balance of the entire power converter.

Points to be noted that relate to the technique described in the embodiments will be described. The technique described in the present specification can be applied to an electrical device other than an electrical device that converts the power of a power source to a power to drive the motors for traveling. The technique described in the present specification can be applied to an electrical device having a case including at least two case portions. The technique described in the present specification may also be applied to an electrical device having a case including three or more case portions.

The connecting portion 3 (the connecting portions 3a to 3e) connecting the first bus bar 24 (the first bus bars 24a to 24e) and the second bus bar 25 (the second bus bars 25a to 25e) is accessible by a connection tool via the through hole 331 provided in the lower case 33. The through hole that allows access of the connection tool may be provided in the upper case 32. A female thread that threadedly engages with the bolt 73 is formed in the connecting portion 3 of the embodiment. The first bus bar and the second bus bar may be connected by connection means other than bolts, for example, by welding or by soldering.

The power module 8a is an example of a first electrical part, and the reactor 7 is an example of a second electrical part. The first bus bar 24 (the first bus bars 24a to 24e) is an example of a first conductor, and the second bus bar 25 (the second bus bars 25a to 25e) is an example of a second conductor. The upper case 32 is an example of a first case, and the lower case 33 is an example of a second case. The shield 332 is an example of a "protrusion that narrows a clearance width around the connecting portion 3 on the inner side of the through hole 331 down to a width that does not allow the bolt-head of the bolt 73 to pass through the clearance".

The specific examples of the present disclosure have been described in detail above; however, these are merely illustrative and do not limit the scope of the claims. The techniques described in the claims encompass various changes and modifications of the specific examples exemplified above. The technical elements described in the present specification or the drawings are technically useful either alone or in various combinations, and should not be limited to the combinations set forth in the claims at the time of the filing of the application. The techniques exemplified in the present specification or the drawings can simultaneously achieve a plurality of objects, and is technically useful through the achievement of one of the objects alone.

What is claimed is:

1. An electrical device comprising:
    a case including a first case and a second case coupled to the first case;
    a first electrical part fixed to the first case;
    a second electrical part fixed to the second case; and
    a connecting portion configured to connect a first conductor extending from the first electrical part and a second conductor extending from the second electrical part to each other, wherein
    either one of the first case and the second case includes a through hole,
    the connecting portion is disposed so as to be visible from the through hole as viewed from an outside of the case,
    the first electrical part and the second electrical part are included in a power converter that converts power of a power source to power to drive a motor for traveling,
    the first electrical part includes a power module housing a switching element included in a voltage boost converter circuit that boosts the voltage of the power source, and
    the second electrical part includes a reactor included in the voltage boost converter circuit.

2. The electrical device according to claim 1, wherein the through hole is configured to allow attachment of a connector of a cable connecting the electrical device and another electrical device.

3. The electrical device according to claim 2, wherein the first electrical part and the second electrical part are configured to be connected to the motor via the cable.

4. The electrical device according to claim 2, further comprising a terminal block supporting a terminal to which the connector is connected, wherein:
    the terminal block is disposed so as to be visible from the through hole as viewed from the outside of the case; and
    the connecting portion is disposed on the terminal block.

5. An electrical device comprising:
    a case including a first case and a second case coupled to the first case;
    a first electrical part fixed to the first case;
    a second electrical part fixed to the second case; and
    a connecting portion configured to connect a first conductor extending from the first electrical part and a second conductor extending from the second electrical part to each other, wherein
    either one of the first case and the second case includes a through hole,
    the connecting portion is disposed so as to be visible from the through hole as viewed from an outside of the case, and
    the connecting portion is configured to connect the first conductor and the second conductor via a bolt.

6. The electrical device according to claim 5, wherein either one of the first case and the second case, which includes the through hole, includes a protrusion that narrows a clearance width around the connecting portion on an inner side of the through hole down to a width that does not allow a bolt-head of the bolt to pass through the clearance.

7. The electrical device according to claim 1, wherein:
    the second case is disposed below the first case; and
    the second electrical part includes a voltage converter circuit that converts the voltage of the power source.

8. The electrical device according to claim 1, wherein:
    the first case includes a second opening that is different from a first opening provided on a side of the first case, on which the first case is coupled to the second case;
    a control board configured to control the power module is fixed to the first case such that the control board is disposed so as to be visible from the second opening; and
    the second opening is covered with a cover.

9. An electrical device comprising:
    a case including a first case and a second case coupled to the first case;
    a first electrical part fixed to the first case;
    a second electrical part fixed to the second case; and
    a connecting portion configured to connect a first conductor extending from the first electrical part and a second conductor extending from the second electrical part to each other, wherein
    either one of the first case and the second case includes a through hole, the connecting portion is disposed so as to be visible from the through hole as viewed from an outside of the case,
the second electrical part is a reactor,
the connecting portion is placed on the reactor, and
the reactor includes a female thread that threadedly engages with a bolt connecting the first conductor and the second conductor.

10. An electrical device comprising:
a case including a first case and a second case coupled to the first case;
a first electrical part fixed to the first case;
a second electrical part fixed to the second case; and
a connecting portion configured to connect a first conductor extending from the first electrical part and a second conductor extending from the second electrical part to each other, wherein
either one of the first case and the second case includes a through hole,
the connecting portion is disposed so as to be visible from the through hole as viewed from an outside of the case,
the second electrical part is a reactor; and
the reactor is placed in the case below a layered body of a cooling unit and a power module.

11. An electrical device comprising:
a case including a first case and a second case coupled to the first case;
a first electrical part fixed to the first case;
a second electrical part fixed to the second case; and
a connecting portion configured to connect a first conductor extending from the first electrical part and a second conductor extending from the second electrical part to each other, wherein
either one of the first case and the second case includes a through hole,
the connecting portion is disposed so as to be visible from the through hole as viewed from an outside of the case,
the second electrical part is a reactor,
the connecting portion is placed on the reactor, and
at least a part of the reactor is disposed so as to be visible from the through hole as viewed from the outside of the case.

12. An electrical device comprising:
a case including a first case and a second case coupled to the first case;
a first electrical part fixed to the first case;
a second electrical part fixed to the second case; and
a connecting portion configured to connect a first conductor extending from the first electrical part and a second conductor extending from the second electrical part to each other, wherein
either one of the first case and the second case includes a through hole,
the connecting portion is disposed so as to be visible from the through hole as viewed from an outside of the case,
the second electrical part is a reactor, and
the second case is provided with a cooling unit that cools the reactor.

13. An electrical device comprising:
a case including a first case and a second case coupled to the first case;
a first electrical part fixed to the first case;
a second electrical part fixed to the second case; and
a connecting portion configured to connect a first conductor extending from the first electrical part and a second conductor extending from the second electrical part to each other, wherein
either one of the first case and the second case includes a through hole,
the connecting portion is disposed so as to be visible from the through hole as viewed from an outside of the case,
the first electrical part is a power module housing a power semiconductor element for converting power,
the second electrical part is a reactor, and
the power module is placed between a control board configured to control the power module and the reactor.

14. An electrical device comprising:
a case including a first case and a second case coupled to the first case;
a first electrical part fixed to the first case;
a second electrical part fixed to the second case; and
a connecting portion configured to connect a first conductor extending from the first electrical part and a second conductor extending from the second electrical part to each other, wherein
either one of the first case and the second case includes a through hole,
the connecting portion is disposed so as to be visible from the through hole as viewed from an outside of the case,
the second electrical part is a reactor, and
a center of gravity of the reactor is positioned shifted from a center of a bottom surface of the second case.

15. The electrical device according to claim 4, wherein:
the second electrical part is a reactor;
the reactor is placed between the terminal block and a capacitor in a horizontal direction; and
the reactor is disposed closer to the terminal block than to the capacitor.

16. A manufacturing method of an electrical device, the electrical device including a case including a first case and a second case coupled to the first case, a first electrical part fixed to the first case, a second electrical part fixed to the second case, and a connecting portion configured to connect a first conductor extending from the first electrical part and a second conductor extending from the second electrical part to each other, either one of the first case and the second case including a through hole, and the connecting portion being disposed so as to be visible from the through hole as viewed from an outside of the case, the manufacturing method comprising:
fixing the first electrical part to the first case;
fixing the second electrical part to the second case;
coupling the first case to the second case; and
fastening the first conductor to the second conductor with a connecting tool via the through hole.

* * * * *